(12) United States Patent
Shenai-Khatkhate

(10) Patent No.: US 7,989,323 B2
(45) Date of Patent: Aug. 2, 2011

(54) DOPING METHOD

(75) Inventor: Deodatta Vinayak Shenai-Khatkhate, Danvers, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 12/819,935

(22) Filed: Jun. 21, 2010

(65) Prior Publication Data

US 2011/0003463 A1 Jan. 6, 2011

Related U.S. Application Data

(60) Provisional application No. 61/269,115, filed on Jun. 19, 2009.

(51) Int. Cl.
*H01L 21/20* (2006.01)
(52) U.S. Cl. .................... 438/478; 257/E21.09
(58) Field of Classification Search ............ 438/22–47, 438/478–506
See application file for complete search history.

(56) References Cited

U.S. PATENT DOCUMENTS

| | | | |
|---|---|---|---|
| 6,956,127 B2 * | 10/2005 | Shenai-Khatkhate et al. .. | 556/70 |
| 7,045,451 B2 * | 5/2006 | Shenai-Khatkhate ........ | 438/602 |
| 7,141,488 B2 * | 11/2006 | Woelk et al. .................. | 438/478 |
| 7,166,734 B2 * | 1/2007 | Shenai-Khatkhate et al. ............. | 556/187 |
| 7,321,048 B2 * | 1/2008 | Shenai-Khatkhate et al. .. | 556/27 |
| 7,390,360 B2 * | 6/2008 | Shenai-Khatkhate et al. .. | 117/84 |
| 7,413,776 B2 * | 8/2008 | Shenai-Khatkhate et al. ......... | 427/255.28 |
| 7,456,445 B2 | 11/2008 | Takeda et al. | |
| 7,488,971 B2 * | 2/2009 | Kobayakawa et al. .......... | 257/13 |
| 7,531,458 B2 * | 5/2009 | Shenai-Khatkhate et al. .............. | 438/681 |
| 7,547,631 B2 * | 6/2009 | Shenai-Khatkhate et al. .............. | 438/680 |
| 7,767,840 B2 * | 8/2010 | Shenai-Khatkhate et al. .. | 556/87 |
| 2007/0173400 A1 * | 7/2007 | Severn et al. ................. | 502/200 |
| 2008/0085373 A1 * | 4/2008 | Karshtedt et al. ............. | 427/487 |
| 2009/0001407 A1 | 1/2009 | Osawa et al. | |
| 2009/0008672 A1 | 1/2009 | Osawa et al. | |
| 2009/0124039 A1 * | 5/2009 | Roeder et al. ................... | 438/99 |
| 2009/0140286 A1 | 6/2009 | Takeda | |
| 2009/0166642 A1 * | 7/2009 | Nakano ........................... | 257/75 |
| 2009/0302434 A1 * | 12/2009 | Pallem et al. ................. | 257/632 |

FOREIGN PATENT DOCUMENTS

| | | |
|---|---|---|
| EP | 1 965 441 | 9/2008 |
| EP | 2 006 919 | 12/2008 |

OTHER PUBLICATIONS

Dittmar et al, "Cyclopentadienyl Germanes as Novel precursors for the CVD of Thin germainium Films" Chemical vapor Deposition 2001, 7 No. 5 , pp. 193-195.*
Green et al.; "Carbon doping of GaN with CBr4 in radio-frequency plasma-assisted molecular beam epitaxy"; Journal of Applied Physics; vol. 95, No. 12; Jun. 15, 2004; pp. 8456-8462.
Armstrong et al.; "Impact of carbon on trap states in n-type GaN grown by metalorganic chemical vapor deposition"; Applied Physics Letters; vol. 84, No. 3; Jun. 19, 2004; pp. 374-376.

* cited by examiner

*Primary Examiner* — Savitri Mulpuri
(74) *Attorney, Agent, or Firm* — S. Matthew Cairns

(57) ABSTRACT

Methods of doping a III-V compound semiconductor film are disclosed.

6 Claims, No Drawings ns such as MOCVD, metalorganic vapor phase epitaxy ("MOVPE"), organometallic vapor phase epitaxy ("OMVPE"), organometallic chemical vapor deposition "(OMCVD") and remote plasma chemical vapor deposition ("RPCVD").

DOPING METHOD

This application claims the benefit of priority under 35 U.S.C. §119(e) to U.S. Provisional Application No. 61/269,115, filed Jun. 19, 2009, the contents of which application are incorporated herein by reference.

The present invention relates generally to the field of organometallic compounds. In particular, the present invention relates to the use of certain organometallic compounds as dopants in semiconductor thin films.

Compound semiconductor thin films, such as III-V semiconductor films, are well known in the electronics industry and are particularly useful in light emitting devices, such as light emitting diodes ("LEDs"). Group III nitrides have bandgap energies that make them particularly suitable for LEDs. Of the Group III nitrides, gallium nitride ("GaN") is particularly suitable.

Compound semiconductor films are typically grown on a substrate using vapor deposition techniques, such as chemical vapor deposition ("CVD"). In such techniques, a reactant (or precursor) is conveyed in a gaseous (or vapor) phase from a source to a deposition reactor containing a substrate. Metalorganic chemical vapor deposition ("MOCVD") is one technique where a metal-containing layer is deposited by decomposing an organometallic precursor compound at elevated temperatures, that is, above room temperature, and either at atmospheric or reduced pressure.

Dopants are typically added to compound semiconductor films, particularly when used in light emitting devices. Such dopants affect the electrical conductivity of the compound semiconductor film. Both silicon and magnesium are conventionally used as n- and p-type dopants, respectively, in Group III nitrides. Each of silicon and magnesium substitutes for gallium in the GaN lattice.

There is a trend in the industry to replace silicon, a "hard" dopant, with a "softer" dopant, such as germanium. For example, U.S. Pat. No. 7,488,971 (Kobayakawa et al.) discloses GaN-containing light emitting devices where the GaN layer is doped with germanium. The germanium dopant sources in this patent are germane, tetramethyl germanium and tetraethyl germanium. However, these germanium sources have significant drawbacks to their use. Germane is toxic and presents significant handling issues, while the use of tetramethyl germanium and tetraethyl germanium as dopants leads to significant carbon incorporation in the Group III nitride film. Such carbon incorporation is detrimental to the performance of the Group III nitride film. High carbon incorporation can make the film insulating and adversely affect the film's luminescence properties. It is known in the industry that carbon incorporation can generally be reduced in MOCVD deposited films by performing the deposition at temperatures that are higher than the decomposition temperature of the precursor. However, doping GaN films with either tetramethyl germanium or tetraethyl germanium at such elevated temperatures fails to reduce carbon incorporation. Thus, there continues to be a need for suitable precursors that can be used to dope III-V compound semiconductors with germanium while providing reduced carbon incorporation.

The present invention provides a method of depositing a III-V compound semiconductor film on a substrate including the steps of: a) providing a substrate in a deposition chamber; b) conveying a Group IIIA metal compound in a gaseous phase to the deposition chamber; c) conveying a Group VA compound in a gaseous phase to the deposition chamber; d) conveying a germanium dopant compound of the formula $R_xGeH_y$ in a gaseous phase to the deposition chamber; e) decomposing the Group IIIA metal compound, the Group VA compound and the germanium dopant compound in the deposition chamber; and f) depositing a germanium doped III-V compound semiconductor film on the substrate; wherein each R is independently chosen from $(C_3-C_7)$branched alkyl, $(C_3-C_7)$cyclic alkyl, $(C_5-C_{20})$cyclopentadienyl and $NR^1R^2$; $R^1$ and $R^2$ are independently chosen from H and $(C_1-C_6)$alkyl; x is an integer from 1-4; y is an integer from 0-3; and x+y=4.

As used herein, the following abbreviations shall have the following meanings, unless the context clearly indicates otherwise: ° C.=degrees centigrade; mol=moles; b.p.=boiling point; eq.=equivalent; g=gram; L=liter; ca.=approximately; cm=centimeter; nm=nanometer; Å=angstrom; sccm=standard cubic centimeter per minute; M=molar; and mL=milliliter. Unless otherwise noted, all amounts are percent by weight and all ratios are molar ratios. All numerical ranges are inclusive and combinable in any order except where it is obvious that such numerical ranges are constrained to add up to 100%. The articles "a" and "an" refer to the singular and the plural.

The term "alkyl" includes straight chain, branched and cyclic alkyl, except where a certain alkyl is specified, such as "branched alkyl". Likewise, "alkenyl" and "alkynyl" include linear, branched and cyclic alkenyl and alkynyl, respectively. "Halogen" refers to fluorine, chlorine, bromine and iodine and "halo" refers to fluoro, chloro, bromo and iodo. Each of the alkyl groups may optionally may have one or more of its hydrogens replaced with a substituent group such as, but not limited to, $(C_1-C_6)$alkyl, $(C_2-C_6)$alkenyl, $(C_1-C_6)$alkoxy, and halo. As used herein, "CVD" is intended to include all forms of chemical vapor deposition such as MOCVD, metalorganic vapor phase epitaxy ("MOVPE"), organometallic vapor phase epitaxy ("OMVPE"), organometallic chemical vapor deposition "(OMCVD") and remote plasma chemical vapor deposition ("RPCVD").

A wide variety of Group IIIA metal compounds may be used in the present invention. Particularly suitable Group IIIA metal compounds are those having the formula $R^3_3M$, where M is a Group IIIA metal and each $R^3$ is independently a $(C_1-C_{10})$ organic radical or hydrogen. Preferably, $R^3$ is H or $(C_1-C_{10})$alkyl, and more preferably H or $(C_1-C_6)$alkyl. In such compounds, the $R^3$ groups may be the same or different, i.e. the compounds may be homoleptic or heteroleptic, respectively. When $R^3$ is H, the Group IIIA compound can be either a neat base-free metal hydride or a tertiary amine adduct thereof. Preferably, M is boron, aluminum, gallium or indium, and more preferably aluminum, gallium or indium. Suitable groups for $R^3$ include alkyl, alkenyl, alkynyl and aryl. The $R^3$ groups may optionally be substituted with one or more dialkylamino groups of the formula NR'R", wherein R' and R" are independently a $(C_1-C_4)$alkyl. By "substituted", it is meant that one or more hydrogens of the organic radical are replaced with a dialkylamino group. Preferably, $R^3$ is H or $(C_1-C_{10})$alkyl, and more preferably H or $(C_1-C_6)$alkyl. Preferably, the Group IIIA metal compound has the formula $R^3_3M$, wherein each $R^3$ is independently a $(C_1-C_6)$alkyl and M is chosen from indium, gallium and aluminum. Exemplary $R^3$ groups include, without limitation, methyl, ethyl, n-propyl, iso-propyl, n-butyl, iso-butyl, tert-butyl, iso-pentyl, and neo-pentyl. A single Group IIIA metal compound or a mixture of Group IIIA metal compounds may be used in the present invention.

Exemplary Group IIIA metal compounds include, but are not limited to, trimethyl indium, triethyl indium, tri-n-propyl indium, tri-iso-propyl indium, dimethyl iso-propyl indium, dimethyl ethyl indium, dimethyl tert-butyl indium, methyl di-tert-butyl indium, methyl di-isopropyl indium, allyl dimethyl indium, methyl diallyl indium, trimethyl gallium, triethyl gallium, tri-iso-propyl gallium, tri-tert-butyl gallium, dimethyl iso-propyl gallium, diethyl tert-butyl gallium, allyl dimethyl gallium, methyl di-iso-propyl gallium, dimethyl tert-butyl gallium, dimethyl neo-pentyl gallium, methyl ethyl isopropyl gallium, trimethyl aluminum, triethyl aluminum, tri-n-propyl aluminum, tri-iso-propyl aluminum, tri-tert-butyl aluminum, dimethyl iso-propyl aluminum, dimethyl ethyl aluminum, dimethyl tert-butyl aluminum, methyl di-tert-butyl aluminum, methyl di-iso-propyl aluminum, allyl dimethyl aluminum, methyl diallyl aluminum and tertiary amine adducts of Group IIIA metal hydrides. Exemplary adducts of Group IIIA metal hydride compounds include, but are not limited to, trimethylamine alane adduct, methylpyrrolidine alane adduct, dimethylethylamine alane adduct, tetramethylguanidine gallane adduct, quinuclidine gallane adduct, methylpyrrolidine indane adduct and tetramethylethylenediamine alane adduct.

The Group IIIA metal compounds of the invention are generally commercially available or may be prepared by methods described in the art, see e.g., U.S. Pat. Nos. 5,756,786, 6,680,397 and 6,770,769. Such compounds may be used as is or may be further purified prior to use.

A variety of Group VA compounds may be suitably employed in the present invention. Exemplary Group VA compounds include, but are not limited to $X_3M^V$; wherein each X is independently chosen from H, halogen, $(C_1-C_6)$ alkyl, $(C_1-C_6)$alkoxy, and aryl; and $M^V$ is a Group VA metal. Group VA metals ($M^V$) include nitrogen, phosphorus, antimony and arsenic. Preferably, $M^V$ is nitrogen, phosphorus or arsenic, and more preferably nitrogen or phosphorus. Particularly suitable Group VA compounds useful in the present invention include ammonia, phosphine, arsine, and stibine, and preferably ammonia, phosphine and arsine. Ammonia is particularly preferred. Hydrazine is also a suitable Group VA compound. Such Group VA compounds are generally commercially available and may be used as is or may be further purified. A single Group VA compound or a mixture of Group VA compounds may be used in the present invention.

The germanium dopant compounds useful in the present invention have the formula $R_xGeH_y$; wherein each R is independently chosen from $(C_3-C_7)$branched alkyl, $(C_3-C_7)$cyclic alkyl, $(C_5-C_{20})$cyclopentadienyl and $NR^1R^2$; $R^1$ and $R^2$ are independently chosen from H and $(C_1-C_6)$alkyl; x is an integer from 1-4; y is an integer from 0-3; and x+y=4. It is preferred that R is chosen from $(C_3-C_7)$branched alkyl and $(C_3-C_7)$cyclic alkyl, and more preferably $(C_4-C_5)$branched alkyl. Preferably, R is $(C_3-C_7)$branched alkyl and y=1-3, more preferably R is $(C_4-C_5)$branched alkyl and y=1-2, and yet more preferably R is $(C_{4-5})$branched alkyl and y=1. $R^1$ and $R^2$ are preferably chosen from H and $(C_1-C_3)$alkyl, and more preferably H and $(C_1-C_2)$alkyl. Preferably, x is an integer from 1-3, and more preferably 1-2. Most preferably, x=1 and y=3.

Exemplary $(C_3-C_7)$branched alkyl and $(C_3-C_7)$cyclic alkyl groups for R include, without limitation, iso-propyl, iso-butyl, sec-butyl, tert-butyl, neo-pentyl, cyclopropyl, cyclopentyl, methylcyclopentyl, dimethylcyclopentyl, cyclohexyl, and methylcyclohexyl. Preferably, R is chosen from iso-propyl, iso-butyl, sec-butyl, tert-butyl, and neo-pentyl, and more preferably R is iso-butyl, sec-butyl and tert-butyl. Exemplary $(C_5-C_{20})$cyclopentadienyls include, without limitation, cyclopentadienyl, methyl-cyclopentadienyl, ethyl-cyclopentadienyl, iso-propyl-cyclopentadienyl, bis-methyl-cyclopentadienyl, bis-ethyl-cyclopentadienyl, bis-iso-propyl-cyclopentadienyl, tris-methyl-cyclopentadienyl, tris-ethyl-cyclopentadienyl, tris-iso-propyl-cyclopentadienyl, tetrakis-methyl-cyclopentadienyl, tetrakis-ethyl-cyclopentadienyl, tetrakis-iso-propyl-cyclopentadienyl, pentamethyl-cyclopentadienyl, pentaethyl-cyclopentadienyl, and penta-iso-propyl-cyclopentadienyl. Typical $NR^1R^2$ groups for R include, but are not limited to, methylamino, ethylamino, iso-propylamino, tert-butylamino, dimethylamino, diethylamino, di-iso-propylamino, and ethylmethylamino.

Any of the above alkyl and cyclopentadienyl groups of R, $R^1$, or $R^2$ may optionally be substituted with one or more amino ($NR^4R^5$) groups, wherein $R^4$ and $R^5$ are independently H and $(C_1-C_6)$alkyl. By "substituted" it is meant that one or more hydrogens on the alky group is replaced with one or more $NR^4R^5$ groups. Exemplary alkyl substituted with $NR^4R^5$ groups include, without limitation, dimethylamino-methyl $((CH_3)_2N-CH_2-)$, dimethylamino-ethyl $((CH_3)_2N-C_2H_4-)$, diethylamino-ethyl $((C_2H_5)_2N-C_2H_4-)$, dimethylamino-propyl $((CH_3)_2N-C_3H_6-)$, and diethylamino-propyl $((C_2H_5)_2N-C_3H_6-)$.

Exemplary germanium dopant compounds include, without limitation, iso-propylgermane, di-iso-propylgermane, tri-iso-propylgermane, tetra-iso-propylgermane, tert-butylgermane, di-tert-butylgermane, tri-tert-butylgermane, tetra-tert-butylgermane, iso-butylgermane, di-iso-butylgermane, tri-iso-butylgermane, tetra-iso-butylgermane, iso-propyl cyclopentyl germane, iso-butyl cyclopentyl germane, cyclopropylgermane, cyclopentylgermane, dicyclopentylgermane, (methylcyclopentyl)germane, (dimethylcyclopentyl) germane, cyclohexylgermane, methylcyclopentadienylgermane, ethylcyclopentadienylgermane, iso-propylcyclopentadienylgermane, pentamethyl-cyclopentadienylgermane, pentaethyl-cyclopentadienylgermane isopropyl(methylcyclopentadienyl)germane, iso-propyl (dimethylamino)germane, di-iso-propyl(dimethylamino) germane, iso-propyl-bis(dimethylamino)germane, tert-butyl (dimethylamino)germane, di-tert-butyl(dimethylamino) germane, tert-butyl-bis(dimethylamino)germane, cyclopentyl-(dimethylamino)germane, cyclopentyl(dimethylamino)germane, diethylamino germane, tert-butyl(diethylamino)germane, cyclopentyl(dimethylamino)germane, cyclopentyl bis(dimethylamino)germane, cyclopentyl(diethylamino)germane, cyclopentyl bis(diethylamino) germane, di-iso-propyl-bis(diethylamino)germane, (dimethylamino)germane, bis(dimethylamino)germane, tris (dimethylamino)germane, tert-butyl(dimethylamino) germane, and di-iso-propyl(dimethylamino)germane.

The germanium dopant compounds may be prepared by a variety of procedures. Typically, the germanium dopant compounds are prepared starting from a compound of the formula $GeY_4$ where Y is a reactive group such as a halogen, an acetate or a $(C_1-C_4)$alkoxy, with halogens being most typical. As used herein, a reactive group is any group attached to the metal that is displaced or exchanged in a subsequent reaction. For example, dialkylamino-substituted germanium compounds may be prepared by the reaction of a dialkylamine in liquid or gaseous forms with a germanium compound having one or more reactive groups and more typically is prepared by the reaction of a dialkylamino lithium reagent with such germanium compound. Branched alkyl and cyclic alkyl germanium compounds may be prepared using Grignard or organolithium reactions. Cyclopentadienyl and alkylcyclopentadienyl germanium compounds may be prepared using Grignard or organolithium reactions with specific metal halide and monomeric cyclopentadienes. In another embodiment, a compound having two or more reactive groups may be reacted with two different lithium reagents in one pot. Such different lithium reagents may be two different organolithium reagents, two different dialkylamino lithium reagents or a mixture of an organolithium reagent and a dialkylamino lithium reagent. In such reaction, the different lithium reagents may be added to the reaction simultaneously or in a stepwise manner. Branched alkyl and cyclic alkyl germanes may also be prepared by a transalkylation reaction using the appropriately substituted aluminum compound. Suitable procedures for preparing the present germanium dopant compounds are those disclosed in U.S. Pat. No. 7,413,776 (Shenai-Khatkhate et al.).

Germanium dopant compounds containing one or more Ge—H bonds can be prepared by the reduction of a germanium halide. In general, such reduction is performed in a dried organic solvent which has been deoxygenated as described above. U.S. Pat. No. 7,413,776 (Shenai-Khatkhate et al.) discloses suitable procedures for preparing such germanium dopant compounds.

The presence of certain impurities in the germanium dopant compounds can be detrimental to the performance of the III-V compound semiconductor film. For example, silicon, which is itself a dopant for III-V compound semiconductors, can be an impurity in germanium sources. If present, silicon would compete with germanium in the doping of the deposited films, resulting in lower concentration of the germanium in the film than desired. Accordingly, it is preferred that the present germanium dopant compounds are substantially free of silicon. By "substantially free" it is meant that the germanium dopant compounds contain less than 1.0 ppm of silicon, preferably less than 0.5 ppm, and more preferably less than 0.25 ppm. A further advantage of the present germanium dopant compounds is that they are substantially free of certain other metallic impurities such as zinc and aluminum, and preferably free of zinc and aluminum. In particular, the present germanium dopant compounds are substantially free of silicon, zinc, and aluminum, and preferably free of such impurities. In another embodiment, the present germanium dopant compounds have "5-nines" purity, i.e. a purity of $\geq 99.999\%$. More typically, such compounds have a purity of "6-nines", i.e. $\geq 99.9999\%$.

Any suitable deposition method may be used to deposit (or grow) the III-V compound semiconductor films of the present invention. Suitable deposition methods include MOCVD, HVPE (hydride vapor phase epitaxy), and MBE. MOCVD is preferably employed from the viewpoints of film thickness controllability and mass productivity.

When using MOCVD, hydrogen, nitrogen, helium or argon is typically employed as a carrier gas. In the formation of GaN, trimethylgallium or triethylgallium is typically employed as the source compound for Ga; trimethylaluminum or triethylaluminum is typically employed as the source for Al; trimethylindium or triethylindium is typically employed as the source for In; and ammonia or hydrazine typically is employed as a source for N.

In chemical vapor deposition processes, the Group IIIA metal compound, the Group VA compound, and the germanium dopant compound are conveyed in the gas phase to a deposition chamber (reactor) containing a substrate. Once in the reactor, the compounds thermally dissociate and a desired III-V compound semiconductor film doped with germanium is deposited on the substrate.

The present invention provides a method of depositing a III-V compound semiconductor film on a substrate including the steps of: a) providing a substrate in a deposition chamber; b) conveying a Group IIIA metal compound in a gaseous phase to the deposition chamber; c) conveying a Group VA compound in a gaseous phase to the deposition chamber; d) conveying a germanium dopant compound of the formula $R_xGeH_y$ in a gaseous phase to the deposition chamber; e) decomposing the Group IIIA metal compound, the Group VA compound and the germanium dopant compound in the deposition chamber; and f) depositing a germanium doped III-V compound semiconductor film on the substrate; wherein each R is independently chosen from $(C_3-C_7)$branched alkyl, $(C_3-C_7)$cyclic alkyl and $NR^1R^2$; $R^1$ and $R^2$ are independently chosen from H and $(C_1-C_6)$alkyl; x is an integer from 1-4; y is an integer from 0-3; and x+y=4.

A substrate for the germanium doped III-V semiconductor layer is placed into a deposition reactor. Suitable substrates may be made of any suitable material, such as: oxide single crystals including sapphire single crystal ($Al_2O_3$; A-plane, C-plane, M-plane, or R-plane), spinel single crystal ($MgAl_2O_4$), ZnO single crystal, $LiAlO_2$ single crystal, $LiGaO_2$ single crystal, and MgO single crystal; Si single crystal; SiC single crystal; GaAs single crystal; AlN single crystal; GaN single crystal; and boride single crystals such as $ZrB_2$ single crystal. Sapphire single crystal and SiC single crystal are preferred substrates.

The Group IIIA metal compounds, the Group VA compounds and the germanium dopant compounds may be solids, liquids or gases. The Group IIIA metal compound, the Group VA compound and the germanium dopant compound are provided in suitable delivery devices. Any of these may be combined and provided from a single delivery device, provided that such compounds are compatible. Typically, each of the Group IIIA metal compound, the Group VA compound and the germanium dopant compound are provided from separate delivery devices. Each delivery device is in fluid communication with the deposition reactor. Each of the compounds is then conveyed from its respective delivery device into the deposition chamber to provide the Group IIIA metal compound, the Group VA compound and the germanium dopant compound in the vapor phase in the deposition chamber. It will be appreciated that more than one vapor delivery device containing Group IIIA metal compounds may be used in order to provide more than one Group IIIA metal compounds in the vapor phase. Likewise, more than one vapor delivery device containing a Group IV compound or germanium dopant compound may be used in order to provide more than one Group VA compound or germanium dopant compound, respectively, in the vapor phase. Additionally, intentional impurities (such as surfactants) can be employed at the start of or during growth to control the formation of the resultant film crystallinity. Strategic additives and surfactants may be employed to control the structure (e.g., cubic or hexagonal), growth uniformity and/or dopant incorporation. In compound semiconductors, the stacking order of the atoms (how the atoms are placed relative to one another while atom ratio is unchanged) can vary, which in turn affects the physical, electrical and optical properties of the resulting crystal. Strategic additives and compositions as outlined in U.S. Pat. No. 7,390,360 (Shenai-Khatkhate et al.) can be used in the present invention.

Bubblers (also known as cylinders) are the typical delivery devices used to provide the present source compounds (Group IIIA metal compound, the Group VA compound and the germanium dopant compound) in the vapor phase to a deposition reactor. Such bubblers typically contain a fill port, a gas inlet port and an outlet port which is connected to a deposition chamber. A carrier gas typically enters the bubbler through the gas inlet port and entrains or picks up precursor vapor. The entrained or carried vapor then exits the bubbler through the outlet port and is conveyed to the deposition chamber. A variety of carrier gases may be used, such as hydrogen, helium, nitrogen, argon and mixtures thereof.

A wide variety of bubblers may be used, depending upon the particular deposition apparatus used. When the particular source compound is a solid, the bubblers disclosed in U.S. Pat. Nos. 6,444,038 (Rangarajan et al.) and 6,607,785 (Timmons et al.), as well as other designs, may be used. For liquid source compounds, the bubblers disclosed in U.S. Pat. Nos. 4,506,815 (Melas et al.) and 5,755,885 (Mikoshiba et al.) may be used, as well as other liquid precursor bubblers. The source compound is maintained in the bubbler as a liquid or solid. Solid source compounds are typically vaporized or sublimed prior to transportation to the deposition chamber.

In conventional CVD processes, a bubbler for supplying a liquid source compound, as well as certain bubblers for supplying solid source compounds, will contain a dip tube which is connected to the gas inlet port. In general, the carrier gas is introduced below the surface of the source compound, also called a precursor, and travels upward through the source compound to the headspace above it, entraining or carrying vapor of the source compound in the carrier gas.

In a further embodiment, any of the present source compounds may be combined with an organic solvent for use in a direct liquid injection process. Any organic solvent which both dissolves the particular source compound and is suitably inert to the particular source compound, as well as matches the vapor pressure, thermal stability, and polarity of the particular source compound, can be employed. Exemplary organic solvents include, without limitation, aliphatic hydrocarbons, aromatic hydrocarbons, linear alkyl benzenes, halogenated hydrocarbons, silyated hydrocarbons, alcohols, ethers, glymes, glycols, aldehydes, ketones, carboxylic acids, sulfonic acids, phenols, esters, amines, alkylnitrile, thioethers, thioamines, cyanates, isocyanates, thiocyanates, silicone oils, nitroalkyl, alkylnitrate, and mixtures thereof. Suitable solvents include tetrahydrofuran, diglyme, n-butyl acetate, octane, 2-methoxyethyl acetate, ethyl lactate, 1,4-dioxane, vinyltrimethylsilane, pyridine, mesitylene, toluene, and xylene. Mixtures of organic solvents may be used. When used in direct liquid injection processes, the concentration of the source compound is typically in the range of 0.01 to 1.5M, and more typically 0.01 to 0.15M. The source compound/organic solvent compositions may be in the form of solutions, slurries or dispersions. Compositions including the present source compound and an organic solvent are suitable for use in vapor deposition processes employing direct liquid injection. Suitable direct liquid injection processes are those described in U.S. Patent Application No. 2006/0110930 (Senzaki).

The deposition reactor contains a chamber which is typically a heated vessel within which is disposed at least one, and possibly many, substrates. The deposition chamber has an outlet, which is typically connected to a vacuum pump in order to draw by-products out of the chamber and to provide a reduced pressure where that is appropriate. MOCVD can be conducted at atmospheric or reduced pressure ranging from 40 Pa to 101.324 kPa (0.3 Torr to 760 Ton). The deposition chamber is maintained at a temperature sufficiently high to induce decomposition of the source compound. The typical deposition chamber temperature is from 150° to 600° C., more typically from 150° to 400° C., the exact temperature selected being optimized to provide efficient deposition. Optionally, the temperature in the deposition chamber as a whole can be reduced if the substrate is maintained at an elevated temperature, or if other energy such as plasma is generated by a radio frequency source.

Deposition is continued for as long as desired to produce a germanium-doped III-V compound semiconductor film having the desired properties. Typically, the film thickness will be from ten to several thousand angstroms or more when deposition is stopped. Exemplary III-V compound semiconductor films which may be doped with germanium according to the present invention include: AlSb, AlAs, AlN, AlP, BN, BP, BAs, GaSb, GaAs, GaN, GaP, InSb, InAs, InN, InP, $Al_xGa_{1-x}As$, $In_xGa_{1-x}AS$, InGaP, AlInSb, GaAsN, GaAsP, AlGaN, AlGaP, InGaN, InGaAs, InGaP, InAsSb, InGaSb, AlInGaN, AlGaInAs, AlGaInP, InAlGaP, InGaAlP, AlInGaP, AlGaAsP, InGaAsP, AlInAsP, AlGaAsN, InGaAsN, InAlAsN, GaAsSbN, GaInNAsSb, and GaInAsSbP. Preferably, the III-V compound semiconductor film is a Group III-nitride film. Preferred Group III-nitride films include AlN, BN, GaN, InN, GaAsN, AlGaN, AlGaN, InGaN, AlInGaN, AlGaAsN, InGaAsN, InAlAsN, GaAsSbN, and GaInNAsSb, more preferably GaN, AlGaN, InGaN, AlnGaN, AlGaAsN, InGaAsN, GaAsSbN, and GaInNAsSb, and even more preferably GaN.

When the present method is used to dope a nitride-based compound semiconductor, a variety of nitride-based compound semiconductors may be employed such as those represented by the general formula $Al_XGa_YIn_ZN_{1-A}M_A$ ($0 \leq X \leq 1$, $0 \leq Y \leq 1$, $0 \leq Z \leq 1$, and $X+Y+Z=1$. The symbol M represents a Group VA element other than nitrogen. $0 \leq A < 1$). Preferably, the nitride-based semiconductor is a gallium nitride-based compound semiconductor represented by the general formula $A_XGa_YIn_ZN_{1-A}M_A$, where $0 \leq X \leq 1$, $0 \leq Y \leq 1$, $0 \leq Z \leq 1$, and $X+Y+Z=1$, the symbol M represents a Group VA element other than nitrogen, and $0 \leq A < 1$.

The nitride-based compound semiconductor may contain more than one Group III metal and may also contain, if necessary, a dopant in addition to germanium. Such additional dopants include, without limitation, Si, Mg, Ca, Zn, Be, P, As, and B. Furthermore, in some cases, such nitride-based compound semiconductor contains not only intentionally added elements, but also impurities inevitably contained depending on the film formation conditions, and the like, and trace amounts of impurities contained in raw materials and reaction tube materials.

III-V compound semiconductor films prepared by the present invention may be composed of an under layer, an n-contact layer, and an n-clad layer. The n-contact layer may also function as the under layer and/or the n-clad layer.

In one embodiment, the under layer may be composed of an $Al_xGa_{1-x}N$ layer ($0 \leq x \leq 1$, preferably $0 \leq x \leq 0.5$, and more preferably $0 \leq x \leq 0.1$). The thickness of the under layer is preferably 0.1 μm or more, more preferably 0.5 μm or more, and most preferably 1 μm or more. By having the film thickness of 1 μm or more, the $Al_xGa_{1-x}N$ layer can be readily obtained with excellent crystallinity.

The under layer may be doped with an n-type impurity (germanium) within a range of $1 \times 10^{17}$ to $1 \times 10^{19}/cm^3$, although it is preferably undoped ($<1 \times 10^{17}/cm^3$) in terms of maintenance of excellent crystallinity.

The temperature for growing the under layer is preferably 800° C. to 1200° C., and it is more preferably adjusted within a range of 1000° C. to 1200° C. If grown within such a temperature range, the under layer can be readily obtained with excellent crystallinity. Moreover, the inner pressure of the MOCVD growth furnace is preferably adjusted to 15 to 40 kPa.

The n-contact layer is composed of a III-V layer, preferably a Group III-nitride layer, and more preferably an $Al_xGa_{1-x}N$ layer ($0 \leq x \leq 1$, preferably $0 \leq x \leq 0.5$, and more preferably $0 \leq x \leq 0.1$), similar to the under layer. The n-contact layer is doped with germanium (an n-type impurity) according to the present invention, and contains germanium at a concentration of $1 \times 10^{17}$ to $1 \times 10^{20}/cm^3$, and preferably $1 \times 10^{18}$ to $1 \times 10^{19}/cm^3$, in terms of maintenance of excellent ohmic contact with the negative electrode, prevention of cracking, and maintenance of excellent crystallinity.

The preferred Group III-nitride-based compound semiconductor of the invention constituting the n-contact layer preferably has the same composition as that of the under layer. The total film thickness of these layers is preferably set within a range of 1 to 20 µm, preferably 2 to 15 µm, and more preferably 3 to 12 µm. If the total film thickness of the n-contact layer and the under layer is within such a range, the crystallinity of the semiconductor can be kept excellent. The n-clad layer is preferably provided between the n-contact layer and the light-emitting layer. By providing the n-clad layer, a non flat portion occurring in the outer most surface of the n-contact layer can be filled. The n-clad layer can be formed of AlGaN, GaN, GaInN, or any of the Group III-nitride films described above. Moreover, the n-clad layer may also take a superlattice structure having a heterojunction, or multiple laminations of these structures. In the case of GaInN, it is needless to say that the band gap is desirably greater than that of the GaInN of the light-emitting layer.

The thickness of the n-clad layer is not particularly limited, although it is preferably within a range of 0.005 to 0.5 µm, and more preferably 0.005 to 0.1 µm.

Moreover, the concentration of the germanium dopant in the n-clad layer is preferably within a range of $1\times10^{17}$ to $1\times10^{20}/cm^3$, and more preferably $1\times10^{18}$ to $1\times10^{19}/cm^3$. The germanium dopant concentration is preferably within this range in terms of maintenance of excellent crystallinity and reduction of the operating voltage for the light-emitting device.

EXAMPLE 1

Deposition of an germanium doped GaN layer is carried out in a suitable cold-wall, vertical, and inductively heated MOCVD reactor operating at atmospheric pressure and dedicated to the GaN deposition. A thin germanium-doped GaN layer having a thickness of 2 µm is deposited, by standard MOCVD technique at 1050 to 1080° C. on a (0001) sapphire substrate having a thickness of 200 µm. The sapphire substrate is chemically treated beforehand by degreasing and pickling in an $H_2SO_4$:$H_3PO_4$ (3:1 ratio) acid solution. The gallium source is trimethylgallium (TMG). Ammonia (Group VA compound) gas is used as the nitrogen source. The germanium dopant is iso-butylgermane. The carrier gas diluent, a 50:50 mixture of nitrogen and hydrogen, is used at flow rate of approximately 1.5 to 3 L/min. The TMG is placed in a bubbler, and is used at the rate of 10 to 15 µmoles/min of total gallium in conjunction with hydrogen bubbled through the bubbler. The ammonia is introduced via a separate line at the flow rate of 1 to 2 L/min. The iso-butylgermane is introduced via a separate line at an appropriate flow rate. The reactants are allowed to decompose on heated sapphire substrate at 1060° C. After the deposition of the germanium-doped GaN layer is completed, the layer is annealed at a temperature of approximately 1080° C. Doped GaN layers thus obtained are expected to have a germanium concentration of $1\times10^{17}/cm^3$ or greater and reduced carbon concentration compared with the corresponding GaN film doped using tetramethylgermane.

EXAMPLE 2

Example 1 is repeated except that the gallium source is triethylgallium and the germanium dopant compound is tert-butylgermane. Doped GaN layers thus obtained are expected to have a germanium concentration of $1\times10^{17}/cm^3$ or greater and reduced carbon concentration compared with the corresponding GaN film doped using tetramethylgermane.

EXAMPLE 3

The procedure of Example 1 is repeated except that a germanium-doped AlGaN film is prepared using trimethylaluminum, TMG and ammonia, with iso-butylgermane as the germanium dopant compound.

EXAMPLE 4

The procedure of Example 1 is repeated except that the following reactants and conditions are used along with appropriate standard MOCVD film growth techniques. In each sample, appropriate substrates are used, for example, sapphire for gallium nitride films, gallium arsenide for gallium arsenide films, and indium phosphide for indium-containing films. $H_2$ is used as the carrier gas. For each of the samples, the particular source compounds, the resulting III-V compound semiconductor film and the particular germanium dopant used are shown in the following table.

| Sample | Ge Dopant | Group IIIA compound/ Group VA compound | Semiconducting Film | Expected Growth Temperature (° C.) |
|---|---|---|---|---|
| 4A | IBGe | TMG/AsH$_3$ | GaAs | 650 |
| 4B | IBGe | TMG/NH$_3$ | GaN | 1050 |
| 4C | IBGe | TEG/DMHy | GaN | 1040 |
| 4D | TBGe | TMG/NH$_3$ | GaN | 1010 |
| 4E | IBIPGe | TMG/PH$_3$ | GaP | 650 |
| 4F | IPGe | TMA/EDMIn/TMG/PH$_3$ | AlInGaP | 700 |
| 4G | TBGe | TEAl/TMG/AsH$_3$ | AlGaAs | 720 |
| 4H | EMATBGe | TMI/AsH$_3$ | InAs | 600 |
| 4I | DIBGe | TMG/MEAs | GaAs | 650 |
| 4J | IPGe | TMI/BPE | InP | 600 |
| 4K | TBGe | TMG/AsH$_3$/PH$_3$ | GaAsP | 700 |
| 4L | TIBGe | TMA/TMG/TMSb | AlGaSb | 600 |
| 4M | EMAIBGe | TMG/PH$_3$/TESb | GaPSb | 625 |
| 4N | DIPGe | TMI/TMG/TIPSb | InGaSb | 620 |
| 4O | CpIBGe | TEG/AsH$_3$/TMSb | GaAsSb | 600 |
| 4P | IBGe | TMA/TEIn/TMG/PH$_3$ | AlInGaP | 650 |
| 4Q | TIPGe | TMA/TMG/AsH$_3$ | AlGaAs | 725 |
| 4R | DMAIPGe | DIPMeIn/TBA | InAs | 600 |
| 4S | DIBGe | TEIn/TBP | InP | 600 |
| 4T | TBGe | TMA/TMI/MIPAs | AlInAs | 620 |
| 4U | DIPGe | TIPIn/TBP | InP | 600 |

-continued

| Sample | Ge Dopant | Group IIIA compound/ Group VA compound | Semiconducting Film | Expected Growth Temperature (° C.) |
|---|---|---|---|---|
| 4V | TIPGe | TMG/NH$_3$ | GaN | 1050 |
| 4W | IBGe | TMA/TEG/NH$_3$ | AlGaN | 1020 |
| 4X | DEAIPGe | TMA/DIPMeIn/PH$_3$ | AlInP | 625 |
| 4Y | TIBGe | TEG/NH$_3$ | GaN | 1050 |
| 4Z | EMAIBGe | TMA/TMI/TEG/BPE | AlInGaP | 650 |
| 4AA | DIBGe | DIPMeIn/TESb | InSb | 425 |
| 4BB | DTBGe | TMA/TMG/DMHy | AlGaN | 1040 |
| 4CC | DMATBGe | TEAl/TEIn/TEG/PH$_3$ | AlInGaP | 700 |
| 4DD | DMATBGe | TEG/NH$_3$ | GaN | 1050 |
| 4EE | IBGe | TEG/TMSb | GaSb | 620 |
| 4FF | DMAIBGe | TMG/TMI/AsH$_3$ | GaInAs | 600 |
| 4GG | MCpIBGe | TEAl/AsH$_3$ | AlAs | 725 |
| 4HH | IBIPGe | TMG/NH$_3$ | GaN | 1050 |
| 4II | TIBGe | TEG/DMHy | GaN | 1020 |
| 4JJ | DIBGe | TMG/AsH$_3$ | GaAs | 650 |
| 4KK | IBTBGe | TMA/TEG/AsH$_3$ | AlGaAs | 700 |
| 4LL | TIBGe | TMI/TEG/NH$_3$ | InGaN | 1010 |
| 4MM | DMATBGe | TMA/TMI/TEG/NH$_3$ | AlInGaN | 950 |
| 4NN | IBGe | TEG/TIPSb | GaSb | 620 |
| 4OO | DMAIBGe | TMA/TMI/AsH$_3$ | AlInAs | 625 |
| 4PP | DTBGe | TEG/NH$_3$ | GaN | 1025 |
| 4QQ | DIBGe | TMA/TMI/TEG/PH$_3$ | AlInGaP | 700 |
| 4RR | DTBGe | TEG/TESb/TBP | GaSbP | 620 |
| 4SS | DIPGe | TMA/TEG/PH$_3$ | AlGaP | 700 |
| 4TT | IBTBGe | TMG/NH$_3$ | GaN | 1040 |
| 4UU | EMAIBGe | TEG/AsH$_3$/NH$_3$ | GaAsN | 950 |
| 4VV | DEATBGe | DIPMeIn/TEG/NH$_3$ | InGaN | 950 |
| 4WW | TBIPGe | TMG/NH$_3$ | GaN | 1050 |
| 4XX | DIBGe | TMA/TMG/AsH$_3$ | AlGaAs | 725 |
| 4YY | TIBGe | TMI/MEAs | InAs | 600 |
| 4ZZ | CpIBGe | TMI/PH$_3$ | InP | 600 |
| 4AAA | EMAIBGe | EDMIn/PH$_3$ | InP | 650 |
| 4BBB | DIBGe | DIPMeIn/TESb | InSb | 450 |
| 4CCC | DMAIPGe | TEG/TMI/PH$_3$ | GaInP | 625 |
| 4DDD | EMATBGe | TMA/TMI/TEG/TBP | AlInGaP | 700 |
| 4EEE | DEAIPGe | TMG/NH$_3$ | GaN | 1000 |
| 4FFF | TIBGe | TIPAl/AsH$_3$ | AlAs | 725 |
| 4GGG | TTBGe | TMA/TMI/TEG/NH$_3$ | AlInGaN | 950 |
| 4HHH | IBEGe | TMG/NH$_3$ | GaN | 1050 |
| 4III | DIBGe | TEG/MEAs/BPE | GaAsP | 650 |
| 4JJJ | DEAIBGe | TEAl/TMG/TBP | AlGaP | 700 |

In the above table, the following abbreviations are used for compounds and ligands: BPE=bisphosphino ethane, DIPMeIn=di-isopropyl methyl indium, DMHy=unsymmetrical dimethylhydrazine, EDMIn=ethyl dimethyl indium, MEAs=monoethyl arsine, MIPAs=Mono-isopropyl arsine, MPA=methylpyrrolidone alane; TBA=tertiarybutyl arsine, TBP=tertiarybutyl phosphine, TEAl=triethylaluminum, TEG=triethylgallium, TEIn=triethyl indium, TESb=triethyl antimony, TIPAl=tri-isopropyl aluminum, TIPIn=tri-isopropyl indium, TIPSb=tri-isoproyl antimony, TMA=trimethylaluminum, TMG=trimethylgallium, TMI=trimethylindium, TMSb=trimethyl antimony, IBGe=iso-butylgermane, DIBGe=di-iso-butylgermane, TBGe=tri-iso-butylgermane, IBIPGe=iso-butyl(iso-propyl)germane, IBTBGe=iso-butyl (tert-butyl)germane, DMAIBGe=dimethylamino-iso-butylgermane, DEAIBGe=diethylamino-iso-butylgermane, EMAIBGe=ethylmethylamino-iso-butylgermane, TBGe=tert-butylgermane, DTBGe=di-tert-butylgermane, TTBGe=tri-tert-butylgermane, DMATBGe=dimethylamino-tert-butylgermane, DEATBGe=Diethylamino-tert-butylgermane, EMATBGe=ethylmethylamino-tert-butylgermane, IPGe=iso-propylgermane, DIPGe=di-iso-propylgermane, TIPGe=tri-iso-propylgermane, IPMGe=iso-propylmethylgermane, IPEGe=iso-propylethylgermane, DMAIPGe=dimethylamino-iso-propylgermane, DEAIPGe=diethylamino-iso-propylgermane, EMAIPGe=ethylmethylamino-iso-propylgermane, CpIBGe=cyclopentadienyl-iso-butylgermane. MCpIBGe=methylcyclopentadienyl-iso-butylgermane, IBTBGe=iso-butyl-tert-butylgermane, TBIPGe=tert-butyl-iso-propylgermane, and EMATBGe=ethylmethylamino-tert-butylgermane.

What is claimed is:

1. A method of depositing a III-V compound semiconductor film on a substrate comprising the steps of: a) providing a substrate in a deposition chamber; b) conveying a Group IIIA metal compound in a gaseous phase to the deposition chamber; c) conveying a Group VA compound in a gaseous phase to the deposition chamber; d) conveying a germanium dopant compound of the formula $R_xGeH_y$ in a gaseous phase to the deposition chamber; e) decomposing the Group IIIA metal compound, the Group VA compound and the germanium dopant compound in the deposition chamber; and f) depositing a germanium doped III-V compound semiconductor film on the substrate; wherein each R is independently chosen from $(C_3-C_7)$branched alkyl, $(C_3-C_7)$cyclic alkyl, $(C_5-C_{20})$ cyclopentadienyl and $NR^1R^2$; $R^1$ and $R^2$ are independently chosen from H and $(C_1-C_6)$alkyl; x is an integer from 1-4; y is an integer from 0-3; and x+y=4.

2. The method of claim 1 wherein the Group IIIA metal compound has the formula $R^3{}_3M$, wherein M is a Group IIIA metal and each $R^3$ is independently a $(C_1$-$C_{10})$ organic radical or hydrogen.

3. The method of claim 1 wherein R is $(C_3$-$C_7)$branched alkyl and y=1-3.

4. The method of claim 1 wherein the germanium dopant is chosen from iso-butylgermane and tert-butylgermane.

5. The method of claim 1 wherein the Group VA has the formula $X_3M^V$; wherein each X is independently chosen from H, halogen, $(C_1$-$C_6)$alkyl, $(C_1$-$C_6)$alkoxy, and aryl; and $M^V$ is a Group VA metal.

6. The method of claim 1 wherein the germanium doped III-V compound semiconductor film has a germanium concentration of $1\times10^{17}$ to $1\times10^{20}/cm^3$.

* * * * *